(12) United States Patent
Dentry et al.

(10) Patent No.: US 7,166,493 B2
(45) Date of Patent: Jan. 23, 2007

(54) PACKAGE WITH INTEGRATED INDUCTOR AND/OR CAPACITOR

(75) Inventors: James F. Dentry, Plymouth, MN (US); Andrezej Peczalski, Eden Prairie, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/811,572

(22) Filed: Mar. 29, 2004

(65) Prior Publication Data

US 2004/0178473 A1    Sep. 16, 2004

Related U.S. Application Data

(62) Division of application No. 10/232,269, filed on Aug. 28, 2002, now Pat. No. 6,744,114.

(51) Int. Cl.
*H01L 21/44* (2006.01)
*H01L 23/52* (2006.01)

(52) U.S. Cl. ............. 438/106; 438/108; 438/109; 438/110; 438/598; 257/777; 257/778; 257/780

(58) Field of Classification Search ......... 257/777, 257/778, 522, 531, 277
See application file for complete search history.

(56) References Cited

U.S. PATENT DOCUMENTS

| | | | |
|---|---|---|---|
| 3,787,252 A * | 1/1974 | Filippazzi et al. | 438/492 |
| 5,326,428 A | 7/1994 | Farnworth et al. | |
| 5,354,695 A | 10/1994 | Leedy | |
| 5,455,445 A | 10/1995 | Kurtz et al. | |
| 5,625,297 A | 4/1997 | Arnaudov et al. | |
| 5,825,092 A * | 10/1998 | Delgado et al. | 257/778 |
| 5,915,168 A * | 6/1999 | Salatino et al. | 438/110 |
| 5,930,637 A * | 7/1999 | Chuang et al. | 438/381 |
| 6,081,030 A * | 6/2000 | Jaouen et al. | 257/728 |
| 6,133,065 A | 10/2000 | Akram | |
| 6,350,633 B1 | 2/2002 | Lin | |
| 6,396,154 B1 * | 5/2002 | Hikita et al. | 257/778 |

(Continued)

FOREIGN PATENT DOCUMENTS

WO    WO 0065689    11/2000

(Continued)

OTHER PUBLICATIONS

Wong, C.P., et al., "Flip the Chip", Science's Compass, vol. 290, pp. 2269-2270, Dec. 22, 2000.

(Continued)

*Primary Examiner*—Carl Whitehead, Jr.
*Assistant Examiner*—James Mitchell
(74) *Attorney, Agent, or Firm*—McDonnell Boehnen Hulbert & Berghoff LLP

(57) ABSTRACT

Methods for attaching two wafers are presented along with devices resulting from such methods. In one illustrative embodiment, a first wafer is provided having pillars for conducting an electric signal. The wafer also includes an electronic device such as an inductor or capacitor that may in some instances consume relatively large amounts of space. The first wafer is bonded to a second wafer so that a circuit on the second wafer may be electrically connected to the electronic device of the first wafer.

19 Claims, 11 Drawing Sheets

U.S. PATENT DOCUMENTS

| | | | |
|---|---|---|---|
| 6,525,922 B2 * | 2/2003 | Winer et al. | 361/306.3 |
| 6,847,066 B2 * | 1/2005 | Tahara et al. | 257/243 |
| 2002/0041021 A1 * | 4/2002 | Sakamoto et al. | 257/690 |
| 2002/0057173 A1 * | 5/2002 | Johnson | 336/200 |

FOREIGN PATENT DOCUMENTS

| | | |
|---|---|---|
| WO | WO 0156921 | 8/2001 |
| WO | WO 0165598 | 9/2001 |

OTHER PUBLICATIONS

"Nature's way of plating", The Economist, p. 8, Jun. 22-28, 2002.

"Making the connection", The Economist, pp. 8 & 10, Jun. 22-28, 2002.

* cited by examiner

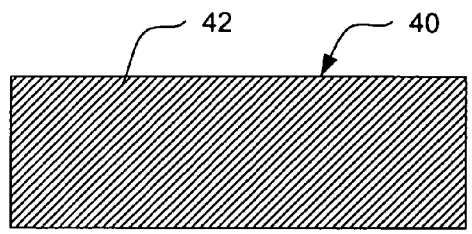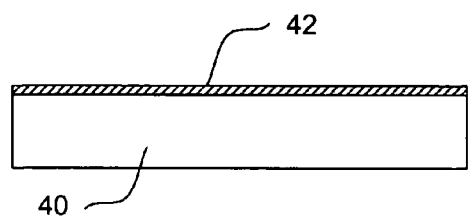
*FIG. 2A*  *FIG. 2B*
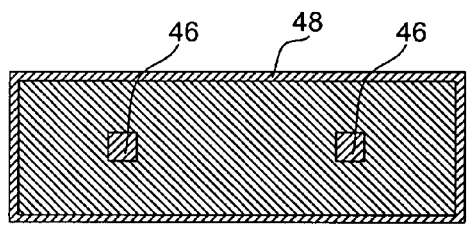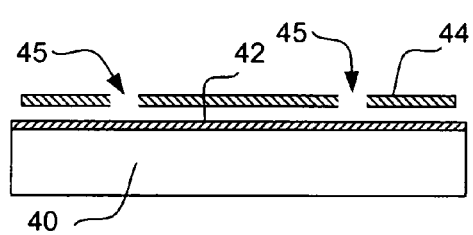
*FIG. 3A*  *FIG. 3B*
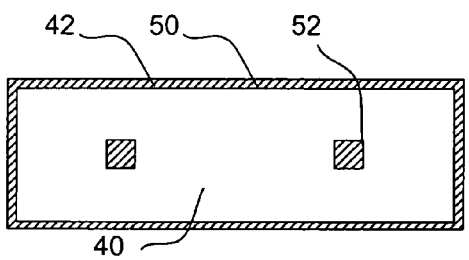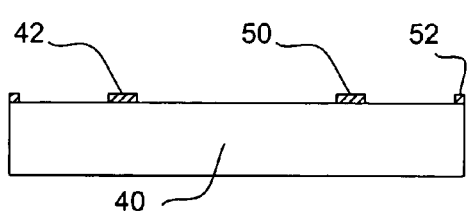
*FIG. 4A*  *FIG. 4B*

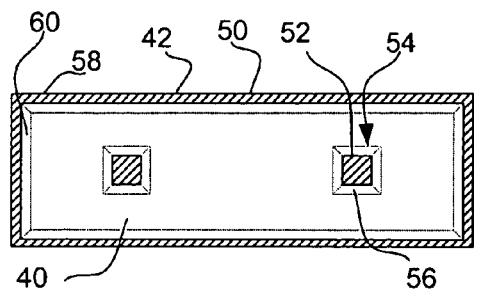 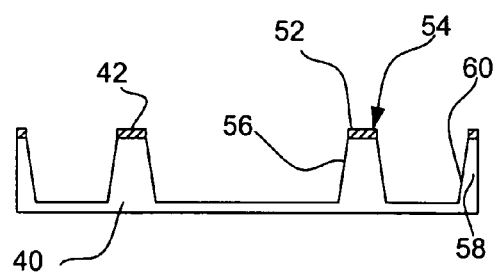
*FIG. 5A*  *FIG. 5B*
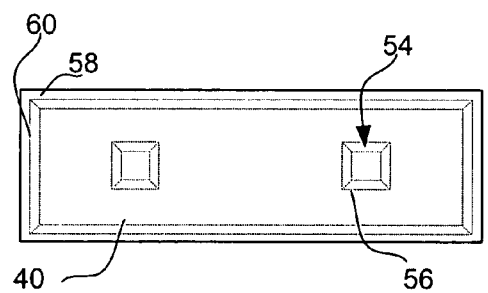 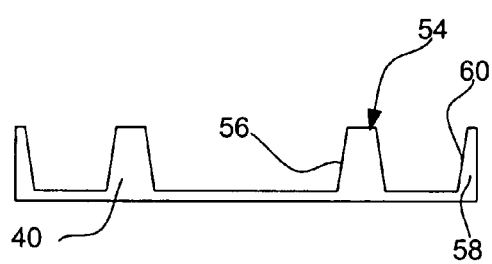
*FIG. 6A*  *FIG. 6B*
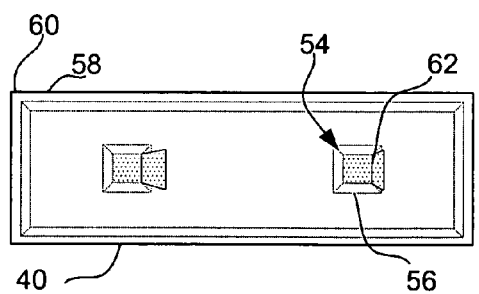
*FIG. 7A*

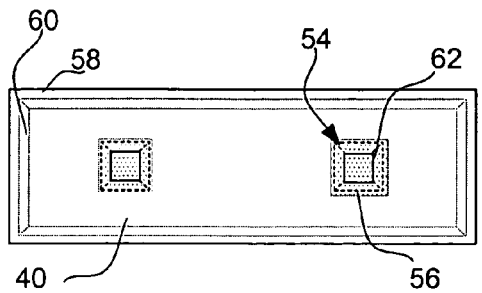 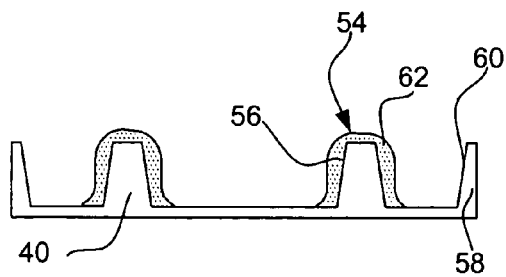
FIG. 8A  FIG. 8B
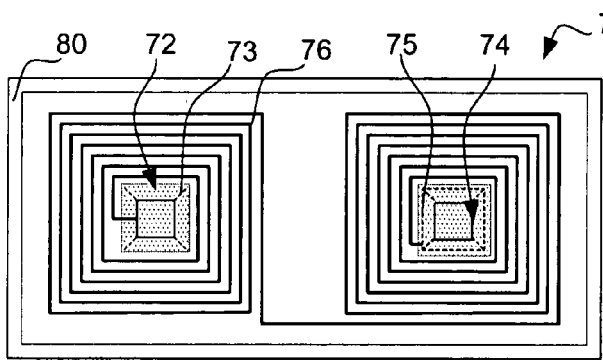 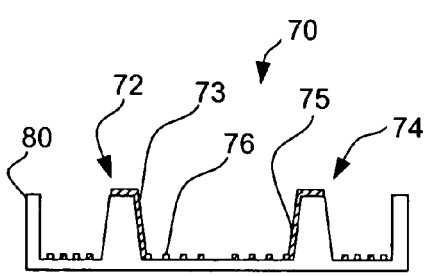
FIG. 9A  FIG. 9B
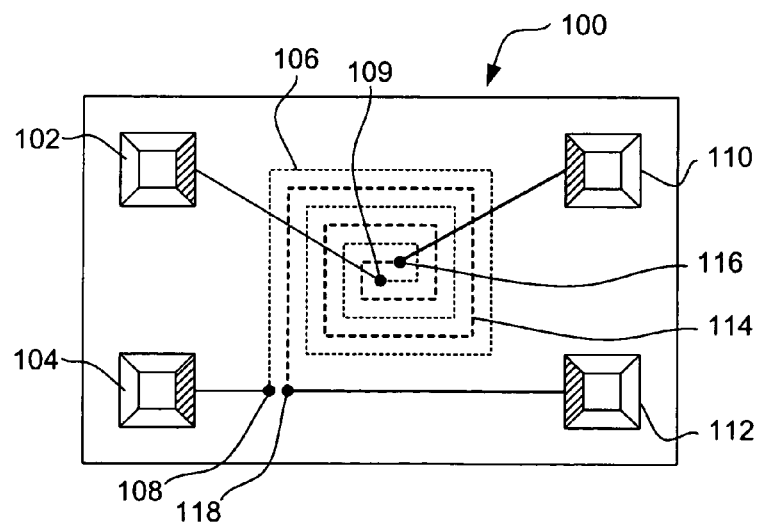
FIG. 10

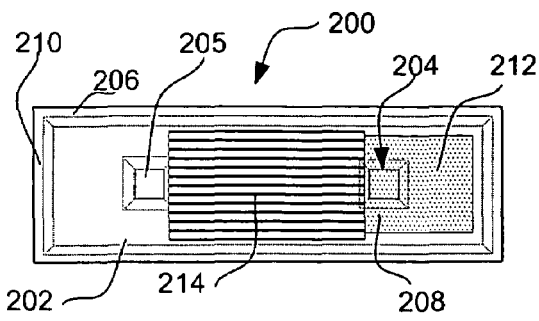
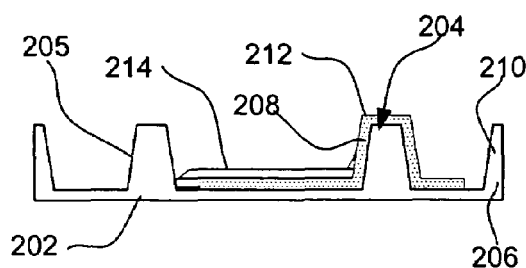
*FIG. 14A*  *FIG. 14B*
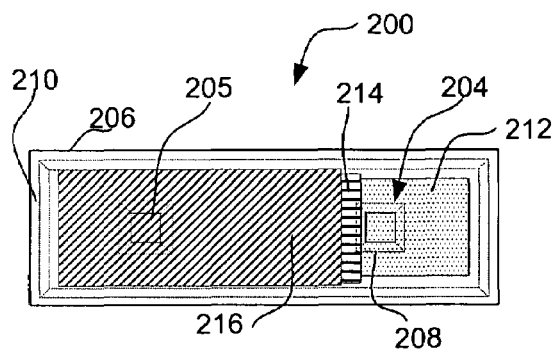
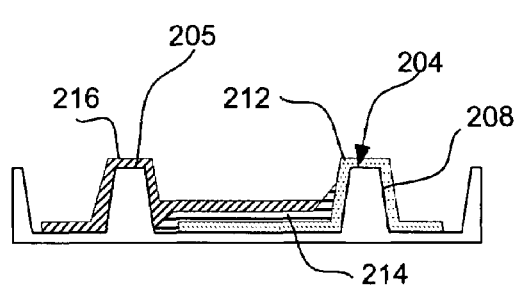
*FIG. 15A*  *FIG. 15B*
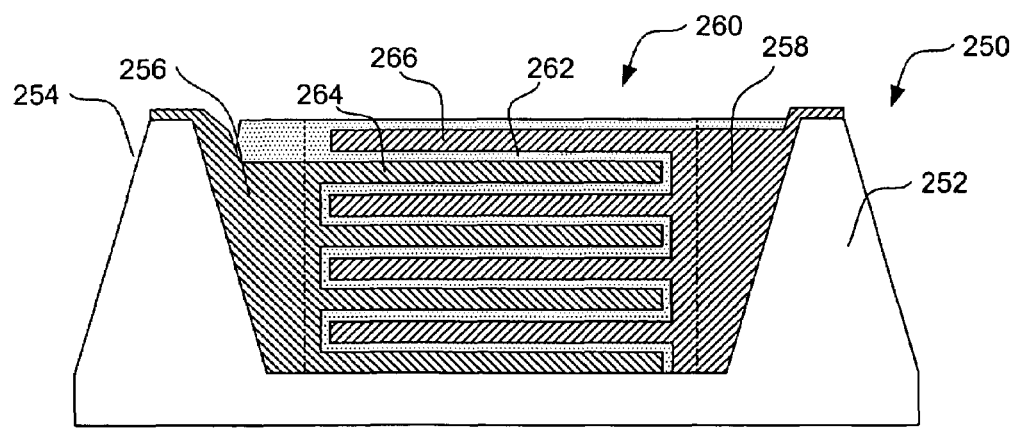
*FIG. 16*

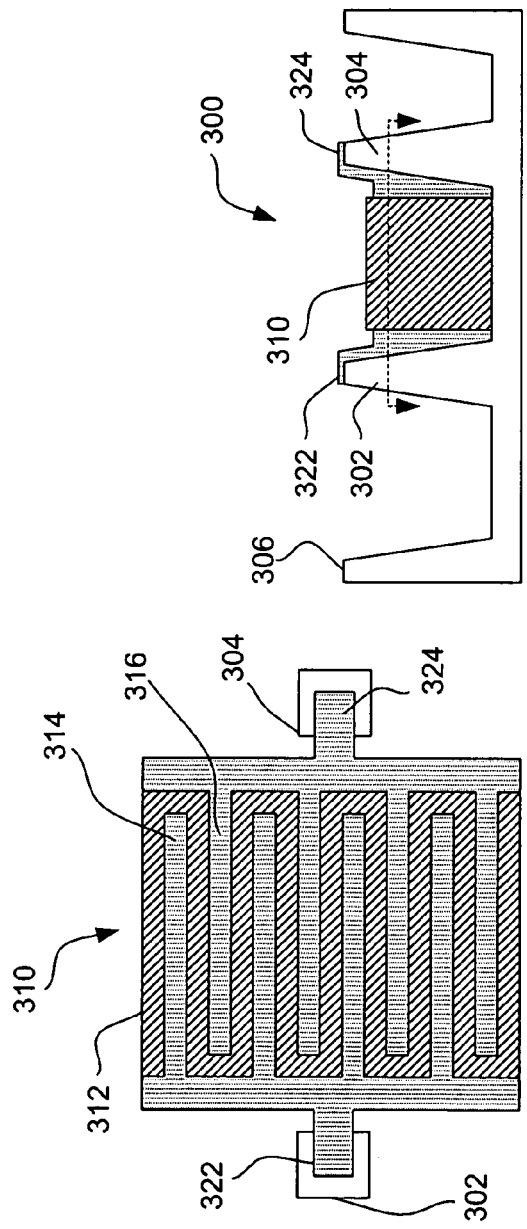
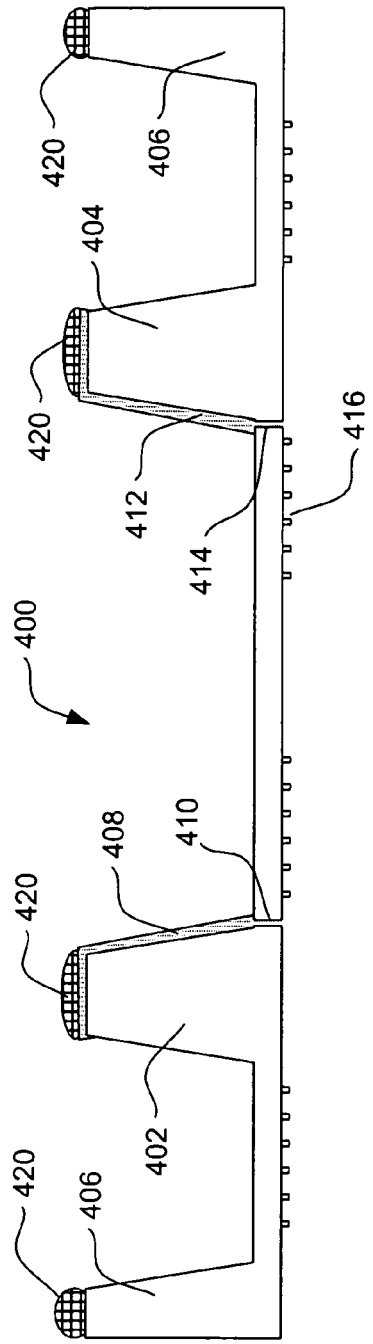

PACKAGE WITH INTEGRATED INDUCTOR AND/OR CAPACITOR

This application is a divisional of U.S. patent application Ser. No. 10/232,269, now U.S. Pat. No. 6,744,144, which was filed on Aug. 28, 2002, entitled, "PACKAGE WITH INTERGRATED CONDUCTOR AND/OR CAPACITOR."

FIELD OF THE INVENTION

The invention is related to the field of wafer attachment. In particular, the present invention is related attaching two wafers together with electronic devices on both wafers.

BACKGROUND

Many analog circuits required inductors and capacitors for tuning or impedance matching. It is known that inductors and capacitors can consume a large area of an integrated circuit, which may increase the cost of integrated circuitry. It is also known that, while inductors and capacitors may be fabricated on a variety of substrates, conducting substrates such as silicon can introduce parasitics that may impair some device characteristics, for example, the quality factor Q.

Many microtechnologies and integrated circuit technologies are packaged in ways to protect components from environmental effects. For example, micro-electro-mechanical systems (MEMS) may include resonating cantilever beams, which can be detrimentally affected by high humidity environments, and so MEMS technologies are often hermetically sealed or even vacuum packaged. Much effort often goes into providing adequate packaging safeguards to prevent corrosion or interference caused by environmental conditions.

SUMMARY OF THE INVENTION

The present invention addresses several aspects of the problems of packaging and provision of devices such as inductors and large capacitors that have proved difficult to include in some integrated circuits. In several embodiments, a device such as an inductor or a capacitor may be provided on a first wafer that includes pillars formed by etching or other subtractive processes. In such embodiments, the first wafer may be attached to a second wafer having other circuit components in such a way as to provide connections between the device on the first wafer and the circuit components on the second wafer. The attachment of the first wafer to the second wafer may also package the circuit, for example, using solder bonds, to provide a hermetic or vacuum seal for the packaged circuit.

In one embodiment, a first wafer is provided of a material, such as glass, that is not electrically conductive, so that high Q inductors, capacitors or other devices may be constructed, and the first wafer includes conductive elements that can be used to connect to a circuit on a second wafer. In another embodiment, two wafers may be attached to one another in such a way as to allow stacking of components on different layers of wafers. In yet another embodiment, a device may be provided on a first wafer and the first wafer may be adapted to allow electrical connection between the device and a circuit on a second wafer so that the device may be thermally, electrically, or magnetically isolated from the rest of the circuit. In at least one embodiment, a device is provided on a first wafer and connected to a circuit on a second wafer such that fields produced in the device and the circuit can be isolated from one another.

BRIEF DESCRIPTION OF THE DRAWINGS

FIG. 2A is an overhead view of a step in an illustrative embodiment;

FIG. 2B is a cross sectional view corresponding to FIG. 2A;

FIG. 3A is an overhead view of a masking step in an illustrative embodiment;

FIG. 3B is a cross sectional view corresponding to FIG. 3A;

FIG. 4A is an overhead view of an illustrative embodiment after development during lithography;

FIG. 4B is a cross sectional view corresponding to FIG. 4A;

FIG. 5A is an overhead view of an illustrative embodiment after etching of the wafer;

FIG. 5B is a cross sectional view corresponding to FIG. 5A;

FIG. 6A is an overhead view of an illustrative embodiment after removal of masking material;

FIG. 6B is a cross sectional view corresponding to FIG. 6A;

FIG. 7A is an overhead view of an illustrative embodiment showing part of a metallization step;

FIG. 8A is an overhead view of an illustrative embodiment after a completed metallization step;

FIG. 8B is a cross sectional view corresponding to FIG. 8A;

FIG. 9A is an overhead view of an illustrative embodiment after completion of wafer fabrication but before attachment;

FIG. 9B is a cross sectional view corresponding to FIG. 9A;

FIG. 10 is an overhead view of another illustrative embodiment including a transformer;

FIG. 14A is an overhead view of an illustrative embodiment after placement of a first dielectric layer;

FIG. 14B is a cross sectional view corresponding to FIG. 14A;

FIG. 15A is an overhead view of an illustrative embodiment after placement of a second metallization layer to form a capacitor;

FIG. 15B is a cross sectional view corresponding to FIG. 15A;

FIG. 16 is a cross sectional view of another illustrative embodiment showing a multi-layer stacked capacitor;

FIG. 17A is a cross sectional view of another illustrative embodiment showing an alternative capacitor design;

FIG. 17B is a cross sectional corresponding to the lines and arrows as shown in FIG. 17A;

FIG. 18 is a cross sectional view of an illustrative embodiment having a back-side placed device and through-vias as well as solder bumps above the pillars;

DETAILED DESCRIPTION

The following detailed description should be read with reference to the drawings. The drawings, which are not necessarily to scale, depict illustrative embodiments and are not intended to limit the scope of the invention. Throughout several of the drawings, the same numbers are used to indicate the same features at different points in the illustrative embodiment methods.

As used herein, the term "about" applies to all numeric values, whether or not explicitly indicated. The term "about" generally, refers to a range of numbers that one of skill in the art would consider equivalent to the recited values (i.e. having the same function or result). In many instances the term "about" may include numbers that are rounded to the nearest significant figure.

It should be understood that several embodiments are adapted for batch processing methods. For example, a number of devices may be formed on a first wafer, the first wafer attached to a second wafer and, then, the attached wafers may be cut into individual dies or packaged chips. While the figures present embodiments focusing on individual devices and circuits, it should be understood that there may be many such individual devices and circuits on a wafer. In several embodiments, a combination of sawing and/or through-wafer etching may be used to separated wafers into dies, leaving ledges behind on the individual dies for attachment of package-level bonding pads.

Figure 1:
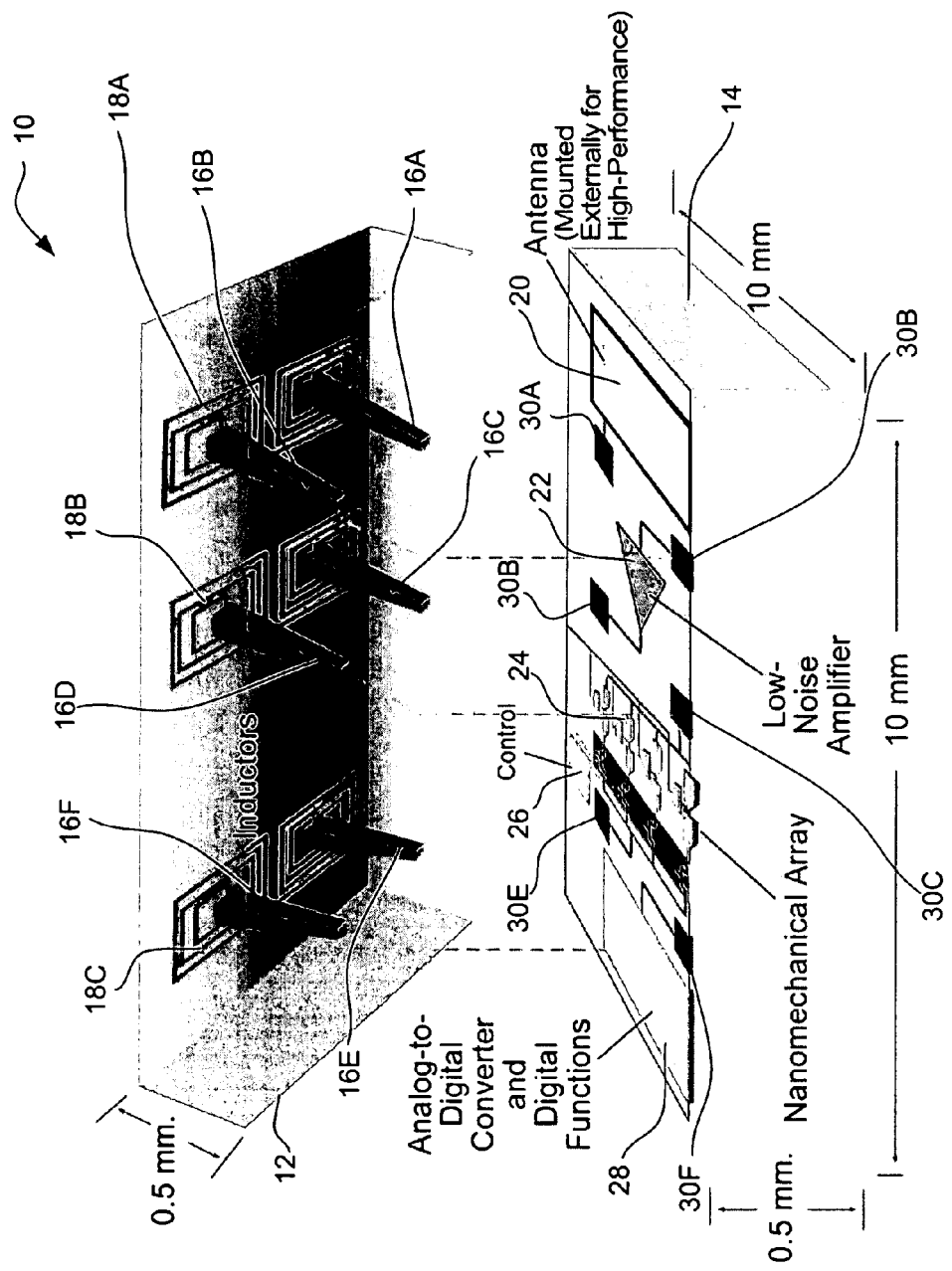
FIG. 1 is a perspective view of an illustrative embodiment.

FIG. 1 is a perspective view of an illustrative embodiment showing a variety of details that may be included in the present invention. A device 10 is shown with a first wafer 12 aligned with a second wafer 14. The first wafer 12 includes pillars 16A–16F and inductors 18. The pillars 16A–16F are shown having at least one slanted side, which helps a metallization or lead to be placed thereupon so that an electrical connection is made between the inductors 18 and the opposite end of the pillars 16A–16F.

The second wafer 14 includes several devices, such as an antenna 20, a low noise amplifier 22, a nanomechanical array 24, a control device 26 and analog to digital conversion and digital device area 28, each of which may be fabricated in a variety of ways known to one skilled in their respective arts. While such devices are shown for the example embodiment of FIG. 1, it should be understood that any variety and combination of devices used in integrated circuits, chip technologies, or otherwise capable of being provided on a wafer may be used.

Contact pads 30A–30F are shown in FIG. 1 on the second wafer 14 in registration with the pillars 16 of the first wafer 12. The illustrative embodiment device shown in FIG. 1 may function, for example, as follows: the antenna 20 may receive a signal which propagates into a circuit including a first inductor 18A by passing from antenna 20 to contact pad 30A, to pillar 16A onto first wafer 12 and through inductor 18A, then proceeding back to the second wafer 14 through pillar 16B onto contact pad 30B. The inductor 18A may provide an impedance matching function for the antenna output, for example, and one advantage of the illustrative embodiment of FIG. 1 is that the inductor is provided above the second wafer 14, saving area on second wafer 14, and also that the first wafer 12 may be made of a low-conductivity material so that inductor 18A may possess less parasitic characteristics than a like-sized inductor provided on second wafer 14 if second wafer 14 were made of, for example, silicon.

From contact pad 30B, signal is passed to the low noise amplifier 22, which then produces an output that goes to contact pad 30C. Again, as before, the signal passes from contact pad 30C via pillar 16C to inductor 18B on the first wafer 12, and returns to the second wafer 14 via pillar 16D to contact pad 30D. Inductor 18B may be provided to aid in impedance matching going into the nanomechanical array, it may be used for compensation of the low noise amplifier 22, or the inductor 18B may provide a filter against noise, for example.

Once signal is returned to the second wafer 14, it passes from contact pad 30D to the nanomechanical array 24. The nanomechanical array 24 may include a control element 26 that may, for example, provide a forced feedback control signal to prevent out of bound oscillation of elements within the nanomechanical array 24. The inclusion of a nanomechanical array 24 as well as the type of devices included and the form of control used are design choices that may vary widely without deviating from the spirit of the present invention; the same is true for each of the other elements including the antenna 20, low noise amplifier 22, and analog to digital converter and digital functions area 28.

After passing through the nanomechanical array 24, the signal goes to contact pad 30E and again is passed to an inductor 18C on the first wafer 12 via a pillar 16E. The signal again passes back to the second wafer 14 via pillar 16F and is fed into the analog to digital converter and digital functions area 28 on the second wafer 14.

FIG. 1 includes several dimensional measurements, including an area of about ten millimeters by ten millimeters for the first wafer 12 and second wafer 14 as well as thicknesses of about five hundred microns for both wafers 12, 14. These dimensions are commensurate with values typical for use in microelectronic fabrication, but should be understood to be merely illustrative, and the dimensions may vary widely with usages, preferences, and the needs of individual applications.

Several advantages may be illustrated easily with reference to FIG. 1. For example, if the inductors were to be included on the second wafer 14, it would require adding significantly to the area of the second wafer 14. Further, if the analog to digital functions block 28 is carried out using, for example, CMOS technologies, a silicon substrate could be used for the second wafer 24, which would limit a designer's ability to count on low parasitic characteristics of any inductor placed on the second wafer. With the illustrative embodiment of FIG. 1, however, the quality of the inductors 18A–C is not dependant upon the material used for the second wafer 14 since they are placed on first wafer 12, which, for example, could be a glass wafer providing a substrate enabling inductors having higher Q factors to be made. Another possible advantage is that the inductors 18A–C are, in the embodiment as shown, increasingly isolated from the rest of the circuitry both thermally and with respect to electric and magnetic fields.

In various embodiments, the materials used for the first wafer 12 and second wafer 14 may vary widely. Either wafer may be made of, for example, group IV materials, alloys of groups III–V, or even II–VI, as well as combinations thereof. Other possible materials include non-crystalline materials such as plastics and glasses, for example. Additionally, each wafer may include special features, for example, one of the wafers could be a silicon-on-insulator wafer.

In one illustrative embodiment for RF applications, antennas and other electronic devices having low capacitive impedances may be used, typically in the range of a few ohms. To match the few ohms to a several kilohm input impedance, for example of the low noise amplifier 22, an inductor of a few microhenries may be needed. With some embodiments of the present invention, as many as fifteen microhenry inductors or more may be incorporated into the package for a typical sized RF integrated circuit. In some embodiments, the first wafer 12 may include an array of inductors and/or capacitors for impedance matching or filtering of various sub-blocks on an integrated circuit.

Large inductors produced by some embodiments contribute to low power dissipation in circuits by matching the high characteristic impedances of various circuit elements and reducing the insertion losses of filters. In one embodiment, a characteristic impedance of up to five kilohms may be created, allowing for significant reduction of amplifier power and resonator noise. For example, a bulk micromachined GaN resonator designed for fifty ohm impedance matching may require as much as 1.9×1.9 millimeters of area at 300 MHz, which is reduced to 190×190 μm at five kilohms.

FIGS. 2–9 illustrate an example method of manufacture that may be used to produce, for example first wafer 12 shown in FIG. 1. The example method includes several common lithography steps and microfabrication steps including masking, material deposition and etching. The specifics of the methods shown are merely illustrative, and are not intended to limit the scope or spirit of the present invention.

FIG. 2A is an overhead view of a step in an illustrative embodiment, and FIG. 2B is a cross sectional view corresponding to FIG. 2A. As shown, wafer 40 has had a layer of photoresist (PR) 42 placed thereupon, for example, by spinning the PR 42. While PR 42 is suggested for the illustrative embodiment, other materials could also be used to mask the wafer 40 depending upon the material of wafer 40 and the desired etch type used in later steps, for example, a nitride layer, an oxide layer, or a metallization layer could replace PR 42. Some of these alternatives could require additional process steps.

FIG. 3A is an overhead view of a masking step in an illustrative embodiment, and FIG. 3B is a cross sectional view corresponding to FIG. 3A. As shown, a mask 44 including holes 45 has been placed over wafer 40 having PR 42. The mask 44 may be used as a contact mask, rather than placed in close proximity, or a masking step could include the use of lenses or the like. Once the mask 44 is properly aligned and placed, the PR 42 may be exposed to UV light, for example.

FIG. 4A is an overhead view of an illustrative embodiment after development during lithography, and FIG. 4B is a cross sectional view corresponding to FIG. 4A. After exposure and development of the negative PR 42, the areas exposed remain behind, forming a border 50 and internal area 52. Positive PR could also be used instead of the negative PR 42, as is well known to those skilled in the art.

FIG. 5A is an overhead view of an illustrative embodiment after etching of the wafer, and FIG. 5B is a cross sectional view corresponding to FIG. 5A. For the illustrative embodiment shown, an etch process is used that did not affect the remaining PR 42, so that border 50 and internal area 52 remain covered with PR, defining the tops of structures including pillar 54 and edge 58. In the illustrative embodiment, the pillar 54 is shown having a slanted edge 56. Slanted edge 56 may be adapted to help a metallization layer, such as layer 62 shown in FIGS. 7A and 7B, to achieve good step coverage from the upper end of pillar 54 to the base. An additional slanted edge 60 appears on edge section 58. In alternative embodiments, rather than a slanted edge 56 used to assist in later metallization, the pillar 54 could be made of a material capable of being doped to become electrically transmissive, for example, if wafer 40 were made of silicon, heavily doping at least a portion of the pillar 54 could make it sufficiently conductive.

A wide variety of etches may be used to etch into the wafer 40. For the embodiment shown in FIG. 5, a directional or anisotropic etch may be used to achieve the slanted edge 56. In other embodiments, a wet etch may be used and directional agitation of the wet etch liquid may assist in providing a slanted edge or to prevent undercutting of the top of pillar 54. Plasma or dry etches could also be used.

FIG. 6A is an overhead view of an illustrative embodiment after removal of etch-stop material, and FIG. 6B is a cross sectional view corresponding to FIG. 6A. For the illustrative embodiment shown, the PR 42 shown in FIGS. 2–5 could be removed with an acetone solution. The result is the base structure for a wafer for use in the illustrative embodiment. For example, a wafer similar to wafer 40 could be used as first wafer 12 in FIG. 1.

In some embodiments, rather than an etching process, mechanical processes such as grinding or laser assisted cutting may be used, obviating the need for process steps including the PR 42 shown in FIGS. 2–5. Likewise, molding processes may be used to provide a pre-formed shaped wafer 40 having the desired shape. For example, a wafer could be created using a mold made by, for example, a process such as X-ray assisted lithography or deep reactive ion etching followed by galvanization, used with an injection molding system. A laminate process could also be used.

Figure 7B:
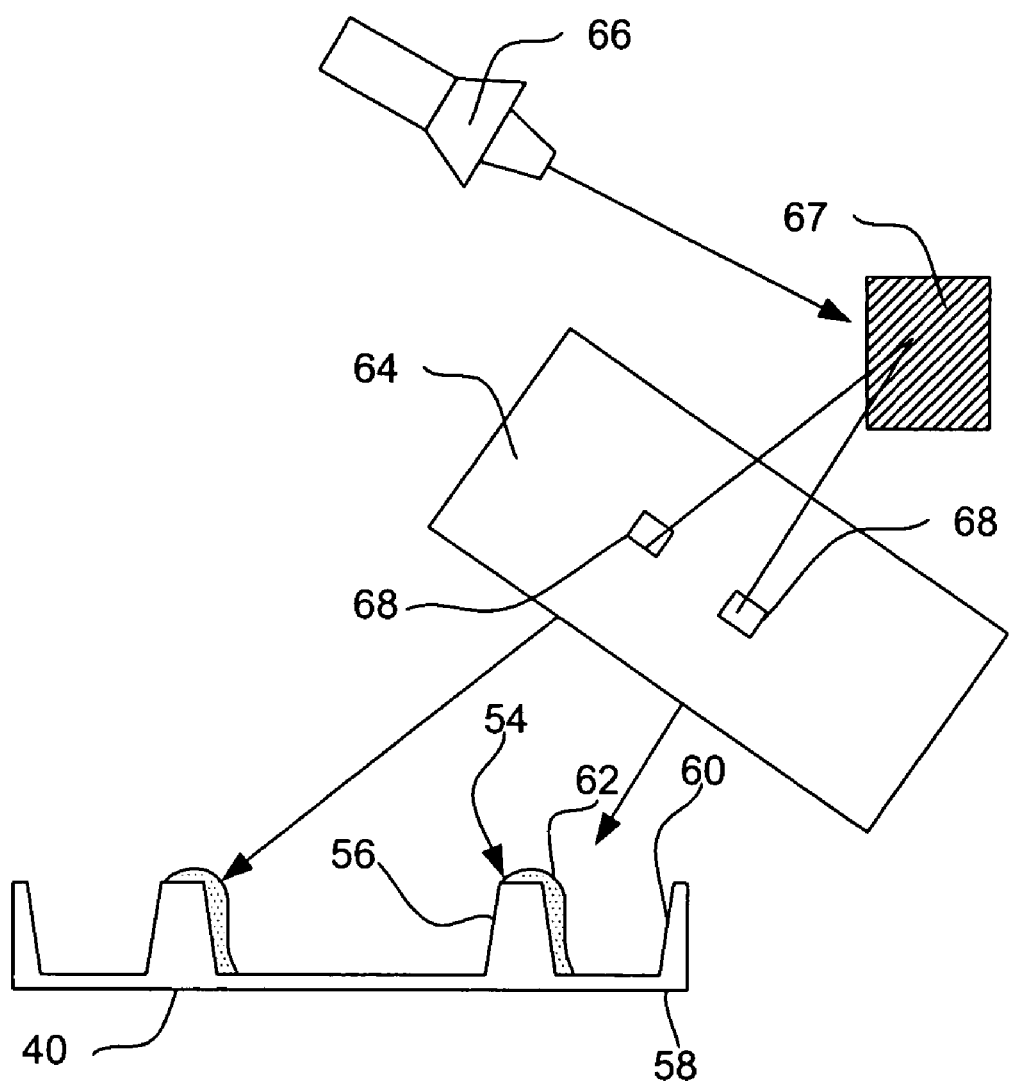
FIG. 7B is a cross sectional view corresponding to FIG. 7A.

FIG. 7A is an overhead view of an illustrative embodiment showing part of a metallization step, and FIG. 7B is a cross sectional view corresponding to FIG. 7A. Wafer 40 including pillars 54 with slanted edge 56 and outer ring structure 58 having slanted edge 60 is shown with a metal layer 62 deposited on a portion of pillar 54. FIG. 7B shows one illustrative method of forming such a metal layer 62 by an evaporation process using a mask 64. For example, in a low pressure environment, an electron beam cannon 66 may direct electrons at a material 67 such as, for example, gold or aluminum. The electrons excite the material 67 to cause a directional evaporation, which then passes toward the wafer 40. Mask 64 stops some of the evaporated material 67, but allows some to pass through holes 68 which are disposed to allow evaporated material to strike pillars 54.

Other processes, such as a shadowing (making use of outer structure 58, for example), selective chemical vapor deposition (CVD), laser assisted CVD, masked sputtering, S-gun sputtering, other evaporation processes (e.g. resistive evaporation), lift-off processes and the like could also be used. As noted above, instead of a metallization 62, the pillar 54 could be doped or otherwise adapted to become conductive.

There are a plethora of alternative methods for making a conductive pillar having varying complexities. For example, in some embodiments, a pillar similar to pillar 54 could be provided using a deep subtractive process (such as deep reactive ion etching) to provide a hole on the front side of a wafer into which a conductive material such as metal may be placed, filling the hole. Then an electric device such as an inductor, capacitor or transistor, for example, could be fabricated or placed adjacent to and in connection with the deposited metal on the front side of the wafer. Material on the backside of the wafer may be removed to expose the metal pillar on the back side. Subsequently, the back side could be attached to a second wafer, in such a way as to provide connection between the exposed metal pillars and the second wafer.

FIG. 8A is an overhead view of an illustrative embodiment after a completed metallization step, and FIG. 8B is a cross sectional view corresponding to FIG. 8A. For example, the process illustrated in FIGS. 7A–B could be continued as the wafer 40 is turned with respect to the source of deposition material. As shown, wafer 40 includes outer structure 58 having slanted edge 60. For some processes, such as shadowing processes, the outer structure 58 may be cleaned after conclusion of the metallization step to remove any metal which lands away from the pillars 54. In some embodiments, any metal deposited on outer structure 58 may be left on the structure 58 so that, in later soldering or sealing processes, the upper surface of wafer 40 defined by outer structure 58 and pillars 54 may be more planar than if metal were left only on pillars 54.

FIG. 9A is an overhead view of an illustrative embodiment after completion of an illustrative example of wafer fabrication, and FIG. 9B is a cross sectional view corresponding to FIG. 9A. As shown, wafer 70 includes pillars 72, 74 having metallizations 73, 75. Inductive element 76 has been placed, for example, by printing processes, so that it connects between metallization 73 of one pillar 72 and metallization 75 of the other pillar. Thus, there is a inductor provided with two ends defined by the pillars 72, 74.

The inductive element 76 may be placed before the metallization step for the pillars takes place, and in some processes is actually provided during the same step. Also, instead of placement of the inductive element 76 on the same side of the wafer 70 as the pillars 72, 74, the inductive element 76 could be placed on the opposing side of the element, with through-vias placed to connect between the metallizations 73, 75 and the inductive element 76, for example as shown in FIG. 18.

In forming inductive element 76, metal may be deposited and patterned on either side of the wafer 70 to form one or more spirals. The inductive element 76, for example, may be fabricated from cold or copper of up to about ten microns thick, and may be in the range of up to about ten millihenries of inductance. In one example, a shadow mask is used to form up to about ten micron thick lines for the inductive element 76 on the same side of the wafer 70 as the pillars 72, 74, with the pit defining the pillars 72, 74 being about forty microns thick. The thickness of the metal in one embodiment may be increased to the desired thickness by plating metal. Controlling the thickness of the metal varies the intrinsic impedance of the inductive element 76; a thicker metal layer can reduce loss. By keeping the depth of the pit defining the pillars 72, 74 greater than the pitch of the lines of the inductive element 76, the electromagnetic fields of the inductive element 76 may be separated from elements on a second wafer attached to the wafer 70.

In one embodiment, the two inductive leads may be placed on opposing sides of the same pillar. This may be accomplished, for example, by providing vias to the opposite side of the wafer so that the second lead may cross spiral lines of an inductive element on the opposite side of the wafer, or by providing two metallization layers with a dielectric layer therebetween, so that the second lead may cross the spiral lines of an inductive element in isolation due to the dielectric layer. Placement of both inductive leads on the same pillar can create concerns over step coverage, particularly with respect to the second metallization layer, since making the second metallization layer very thick could lead to concerns over interference with the lead formed on the single pillar by the first metallization layer. Using two pillars may avoid any such problems.

FIG. 10 is an overhead view of another illustrative embodiment including a transformer. Wafer 100 includes pillars 102, 104 that are connected to an inductive element 106 by vias 108, 109 that pass through wafer 100, since the inductive element 106 is placed on an opposing side of wafer 100 to that of the pillars 102, 104, as indicated by the dashed line. Wafer 100 also includes a second set of pillars 110, 112 that likewise connect to an inductive element 114 on the opposing side of pillars 110, 112 by way of vias 116, 118. The two inductive elements 106, 114 are interwoven in such a way as to create a transformer. Thus, a circuit connected by way of pillars 102, 104 to inductive element 106 could be DC isolated from a circuit connected by way of pillars 110, 112 to inductive element 114 while maintaining an AC relationship defined by the number of turns and other characteristics of the inductive elements 106, 114.

Figure 11A:
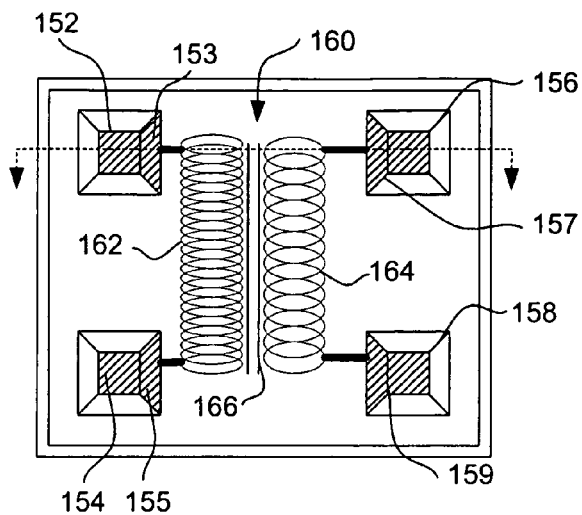
FIG. 11A is an overhead view of another illustrative embodiment including a discrete transformer.
Figure 11B:
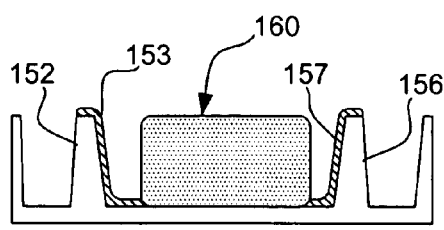
FIG. 11B is a cross sectional view corresponding to FIG. 11A.

FIG. 11A is an overhead view of another illustrative embodiment including a discrete transformer, and FIG. 11B is a cross sectional view corresponding to FIG. 11A. A wafer 150 includes pillars 152, 154, 156, 158 having metallizations 153, 155, 157, 159 along with transformer device 160 having first coil 162, second coil 164 and core 166. As shown in FIG. 11B, first pillar 152 is connected via metallization 153 to the transformer device 160, while third pillar 156 is connected via metallization 157 to the transformer device 160. Likewise, though not shown in a cross section view, the overhead view in FIG. 11A shows that second pillar 154 is connected via metallization 155 to the transformer device 160 as well as fourth pillar 158 connected via metallization 159 to the transformer device 160. In such a configuration, the transformer device may be constructed separately and could then be placed, for example in a bonding step, on the wafer 150 between the pillars.

Such a method and device may provide improvements if, for example, the transformer device 160 function may be verified before placement on the wafer 150 to improve fabrication yields over fabrication of the combined device as shown, for example, in FIG. 10. Such benefits would have to be compared to the added costs of fabrication, particularly with the extra process steps including placement of the transformer device 160. For the device use shown in FIGS. 11A–11B, the wafer 150 could be viewed as a carrier wafer for providing additional devices for an integrated circuit, thus allowing "vertical" fabrication above the integrated circuit substrate.

Figure 12A:
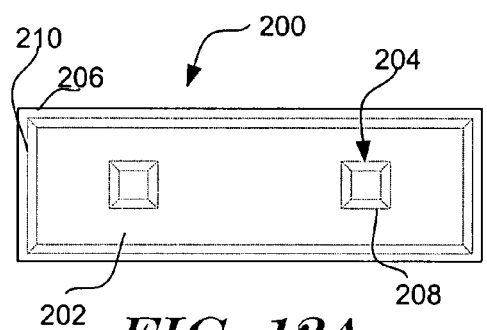
FIG. 12A is an overhead view of an illustrative embodiment similar to that of FIG. 6A.
Figure 12B:
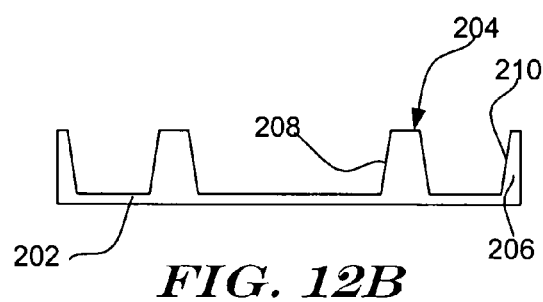
FIG. 12B is a cross sectional view corresponding to FIG. 12A.

FIG. 12A is an overhead view of an illustrative embodiment similar to that of FIG. 6A, and FIG. 12B is a cross sectional view corresponding to FIG. 12A. Wafer 200 includes substrate 202 that has been machined, molded or etched, for example, into the shown structure, including first pillar 204 and outer ring 206. First pillar 204 includes pillar slanted edge 208, and outer ring 206 also includes a ring slanted edge 210. The wafer 200 is shown as an initial structure for use in the illustrative process shown in FIGS. 13–15.

Figure 13A:
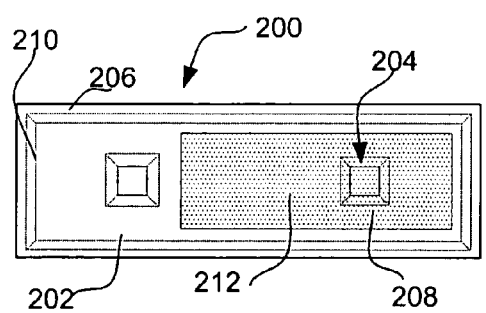
FIG. 13A is an overhead view of an illustrative embodiment after placement of a first metallization layer over a portion of the wafer.
Figure 13B:
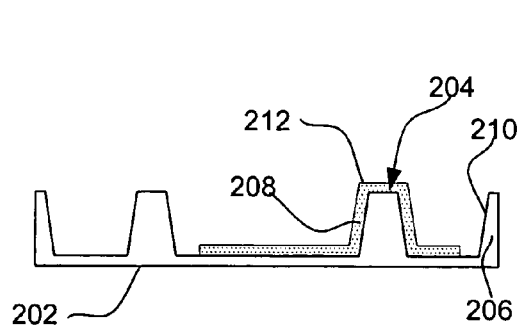
FIG. 13B is a cross sectional view corresponding to FIG. 13A.

FIG. 13A is an overhead view of an illustrative embodiment after placement of a first metallization layer over a portion of the wafer, and FIG. 13B is a cross sectional view corresponding to FIG. 13A. As shown, metallization layer 212 covers first pillar 204 including pillar slanted edge 208, but does not reach portions of substrate 202 including the outer ring 206 and ring slanted edge 210. The metallization layer 212 may be provided by any suitable method of deposition, including, for example, sputtering or evaporation. Because the area covered by the metallization in the illustrative example does not include all of the substrate 202, a directional method such as evaporation may be used in conjunction with a mask, if desired.

FIG. 14A is an overhead view of an illustrative embodiment after placement of a first dielectric layer, and FIG. 14B is a cross sectional view corresponding to FIG. 14A. Dielectric layer 214 is placed over metallization layer 212 between the pillars 204, 205, but does not extend over the pillars 204, 205, but may extend up the first pillar 204 slanted side 208 to isolate one side of first pillar 204. Any suitable deposition process may be chosen for dielectric layer 214. However, because the dielectric layer 214 will be used as a dielectric for a capacitor, for the illustrative example shown it would be preferable to select a deposition process for the dielectric layer 214 which can minimize the occurrence of pinholes without requiring excessive thickness.

FIG. 15A is an overhead view of an illustrative embodiment after placement of a second metallization layer to form a capacitor, and FIG. 15B is a cross sectional view corresponding to FIG. 15A. A second metallization layer 216 is formed over the second pillar 206 while, extending over a portion of dielectric layer 214 and first metallization layer 212 without extending into an area of the substrate 202 where the first metallization layer 212 is uncovered by the dielectric layer 214, including first pillar 204. At this point in the process, the wafer 200 includes a capacitor formed of the dielectric layer 214 sandwiched between two isolated metallization layers 212, 216 on substrate 202. One "lead" of the capacitor is therefore the portion of the first metallization layer 212 atop first pillar 204, while the other "lead" of the capacitor is the portion of the second metallization layer 216 atop the second pillar 205.

In an illustrative embodiment, the dielectric may be $TaO_5$, which can be used to form capacitors in the range of about ten picofarads, a size commonly used for example in LC filter circuits. Any of a wide variety of other dielectrics may be used in other embodiments.

FIG. 16 is a cross sectional view of another illustrative embodiment showing a multi-layer stacked capacitor. As shown, wafer 250 includes pillars 252, 254, between which there is a capacitive structure 260. The first pillar 252 includes a first metallization layer 256 extending over the top, while the second pillar includes a second metallization layer 258 as well. The capacitive structure includes dielectric layer 262 sandwiched between alternating metal layers 264, 266 that connect to either the first metallization layer 256 or the second metallization layer 258. Thus, capacitive structure 260 may be fabricated off of the wafer 250 and then attached to the wafer 250 between pillars 252, 254, and the metallization layers 256, 258 added after placement. Alternatively, the capacitive structure 260 may be placed between pillars 252, 254 and the metallization layers 256, 258 added to secure the capacitive structure 260 to wafer 250. As is known in the art, a multi-layer sandwiched capacitor can provide a three-dimensional structure requiring less area in exchange for height than a simpler planar structure. Note also that, for the illustrative embodiment shown in FIG. 16, there is no outer structure, and instead the pillars 252, 254 are the outermost portions of the wafer 250. This is not a required feature, but shows that, for some embodiments, there is no need for the outer structure or ring as shown in several illustrative embodiments herein.

FIG. 17A is a cross sectional view of another illustrative embodiment showing an alternative capacitor design, and FIG. 17B is a secondary cross sectional view corresponding to the lines and arrows as shown in FIG. 17A. As shown, the illustrative embodiment shows a capacitive element 310 placed between pillars 302, 304 on a structure 300 including an outer ring 306. As illustrated in FIG. 17A, the capacitive element 310 again includes a multi-layer sandwiched capacitor, with dielectric 312 disposed between alternating metal sheets 314, 316, but this time the capacitor is horizontally defined, rather than vertically as shown in FIG. 16A. Metallization layers 322, 324 extend over pillars 302, 304. As illustrated by FIG. 17A, one metallization layer 312 connects to one set of metal sheets 314, while the other metallization layer connects to the other set of metal sheets 316.

There are many methods for creating the horizontal multi-layer capacitive element 310. For example, the capacitive element 310 could be fabricated off-wafer and later attached. Metal could be deposited and patterned, with dielectric 312 deposited between metal sheets 322, 324 after patterning is complete. Likewise, the dielectric 312 could be deposited and patterned, with metal sheets 322, 324 added later. In another embodiment, the dielectric 312 could be a part of a wafer substrate, and an etch for the area corresponding to the capacitive element 310 chosen that would provide narrow vertical channels in the dielectric 312 so that metal could be later added. Many such permutations can be used without deviating from the spirit of the present invention.

FIG. 18 is a cross sectional view of an illustrative embodiment having a back-side placed device and through-vias as well as including solder bumps above the pillars. As shown, wafer 400 includes pillars 402, 404 and outer ring structure 406. First metallization layer 408 is deposited on one side of the first pillar 402 and is connected to a conductive portion extending through via 410 to the opposing side 411 of the wafer 400, where it can connect to device 416. Likewise, second metallization layer 412 is deposited on one side of the second pillar 404 and extends through via 414 to connect to device 416.

There are several potential advantages to placing device 416 on the opposing side 411. For example, printing techniques can be used on the planar opposing side easily to provide precise inductors. In one embodiment, the wafer may be made of a semiconductor such as silicon, and opposing side 411 may include additional devices such as CMOS or other integrated circuit technology.

Also shown in FIG. 18 are solder bumps 420 atop the outer ring 406 and the pillars 402, 404 and metallization layers 408, 412. The solder bumps may be used to connect the wafer 400 to a second wafer having corresponding connection pads for the pillars 402, 404, for example. The size of the solder bumps may be varied to account for any non-planarity caused by deposition of metal above the pillars 402, 404. In some other embodiments, metal deposited atop the pillars 402, 404 may be deposited atop the outer ring as well, eliminating potential stresses after attachment caused by non-planar features on the wafer 400.

Figure 19A:
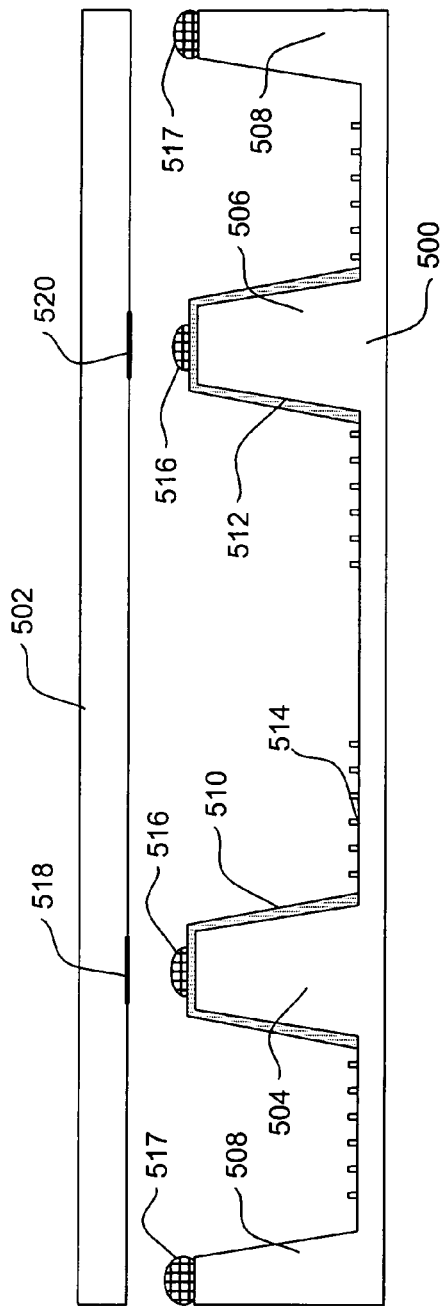
FIGS. 19A–19B are cross sectional views of an illustrative embodiment method of attachment.
Figure 19B:
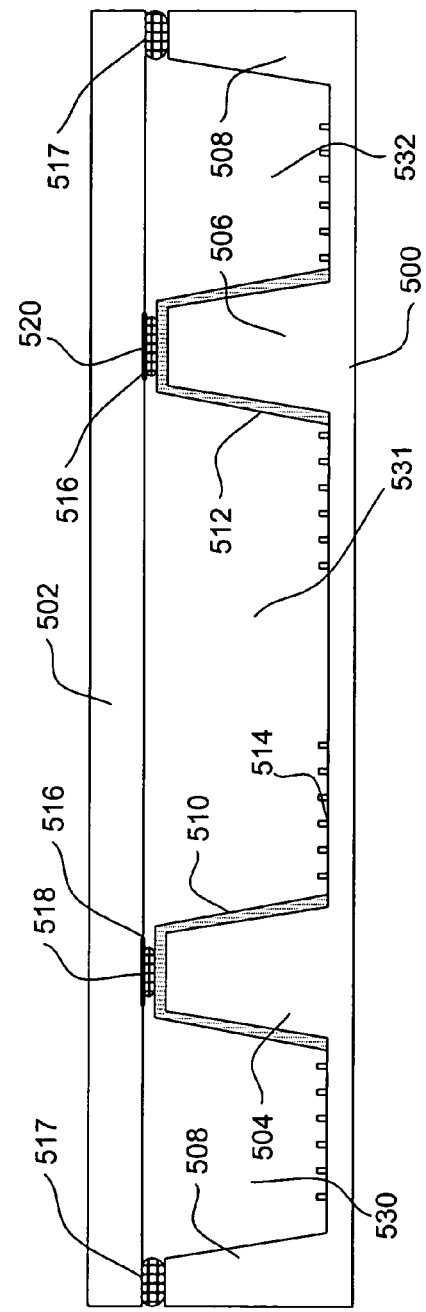

FIGS. 19A–19B are cross sectional views of an illustrative embodiment method of attachment of first wafer 500 to a second wafer 502. First wafer 500 may be designed as discussed herein, including pillars 504, 506 and, in the illustrative embodiment shown, outer ring structure 508. Metallizations 510, 512 may be included to provide connections with a device 514 disposed on first wafer 500 to the tops of the pillars 504, 506. Solder bumps 516, 517 are placed atop the pillars 504, 506 and outer ring 508. Notably, the solder bumps 517 placed on the outer ring structure 508 are slightly larger than the solder bumps 516 placed atop pillars 504, 506, which allows for the non-planarity introduced by inclusion of the metallization layers 510, 512 atop the pillars 504, 506 but not above the outer ring 508.

Contact pads 518, 520 appear on the second wafer 502, corresponding to the locations of the pillars 504, 506 on the first wafer 500. The contact pads 518, 520 may be of any material suitable and design for providing a junction between the pillars 504, 506 and an electronic circuit on the second wafer 502. The contact pads 518, 520 may be sized to reduce the area used on the second wafer 502, but may also be sized to anticipate the tolerances of particular fabrication techniques and the possibility of solder flow during attachment or reflow during use. This points out a further reason for smaller solder bumps 516, which may be that, while excess solder around the outer ring 508 may cause little harm if any, excess solder in the interior may interfere with electronics or devices on the second wafer 502. Also, the contact pads 518, 520 may be shaped to prevent solder that reflows during use of the overall device from flowing into other devices on the second wafer 502. Contact pads 518, 520 may be adapted to encourage or improve adhesion to solder bumps 516 as well. Such pads, though not shown in FIGS. 19A–19B, may also be included to correspond to the outer ring 508. While the solder bumps 516, 517 are shown on the first wafer 500 in the illustrative embodiment of FIGS. 19A–19B, they may be placed on the second wafer 502, or on both, in other embodiments. Notably, the pillars 504, 506 provide electrical connections between the first wafer 500 and the second wafer 502 without extending outside of the perimeter of the first wafer 500 and second wafer 502 as defined by the outer ring structure 508.

After alignment as shown in FIG. 19A, the first wafer 500 may be brought into contact with the second wafer 502. The entire structure may then be heated to cause flow of the solder bumps 516, 517, and later cooled to solidify the solder and secure a bond between the first wafer 500 and the second wafer 502, as shown in FIG. 19B. During the solder attachment step, the surrounding environment may be controlled, for example, to be kept at or near vacuum conditions.

One or more chambers 530, 531, 532 may be defined during the attachment step. The chambers 530, 531, 532 may encapsulate vacuum or other environmental conditions existing at the time of attachment. In another embodiment, one or more of the chambers 530, 531, 532 may be filled with an underfill substance that, for example, may provide adhesive qualities or heat sinking qualities, or may aid in relieving thermal stresses.

Other embodiments make use of the wide variety of chip-to-chip bonding techniques. For example, glass frit, anodic bonding, fusion bonding, PR adhesion, polymethyl methacrylate bonding, waxes, low temperature glass melt, other adhesives and the like may also be substituted. In some embodiments, an adhesive may be used in place of the outer solder bumps 517, for example, with conductive adhesives in place of the solder bumps 516 as well. In another embodiment, the contact pads 518, 520 and/or pillars 504, 506 with metallizations 510, 512 may be adapted so that, when the outer ring structure 508 adheres to the second wafer 502, electrical connections are made on the interior, for example, under pressure exerted by the wafers 500, 502.

With respect to the illustrative embodiment shown in FIGS. 19A–B, use of a solder seal may allow absorption of stresses which can result from thermal expansion differences caused by differences between the thermal expansion coefficients of the first wafer 500 and second wafer 502. One potential advantage of low-temperature reflow solder (as well as other attachment methods not requiring high temperature anneals and the like) may be that thermal expansion stresses between first wafer 500 and second wafer 502 may remain small if temperatures remain in a similar range throughout the fabrication and use of the final device.

In embodiments using vacuum package methods, a small open trench or hole may be provided through either of the wafers 500, 502 extending into the cavity formed between the wafers 500, 502. Such a trench or hole may be provided to remove residual gasses that can appear during bake-out of the device prior to final packaging. Also, getters may be used to remove residue gasses and maintain vacuum, too.

Figure 20:
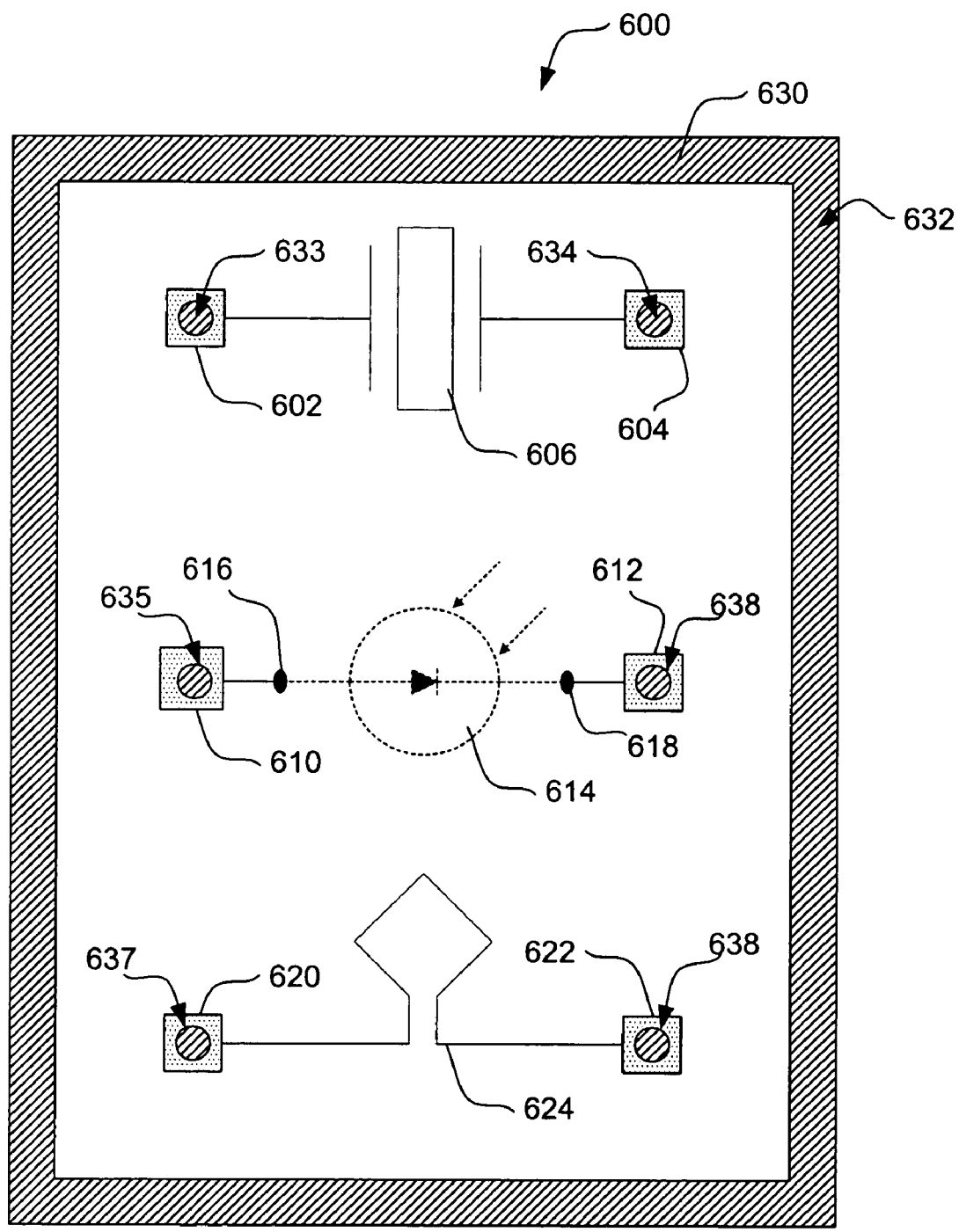
FIG. 20 is an overhead view of another illustrative embodiment including several additional devices.

FIG. 20 is an overhead view of another illustrative embodiment including several additional devices to provide examples of a useful application of the present invention. As shown, a wafer 600 includes a first pillar 602 and a second pillar 604. The first pillar is electrically connected to a crystal 606 that may be used, for example, as a part of a timing circuit. One possible advantage of such a connection would be to vibrationally and thermally isolate a timing circuit crystal from, for example, MEMS oscillators or heat-producing circuitry. Further, some desirable crystals may prove bulky for use in integrated circuits, and the present methods could be used to take a crystal 606 off-chip.

Also shown are third pillar 610 and fourth pillar 612, this time electrically connected by vias 616, 618 to a photodiode 614 disposed on an opposite side of wafer 600. One useful advantage of such a configuration is that, while it has proved difficult to fabricate silicon photodiodes, combinations of Indium, Gallium, Arsenide and Phosphorus built on GaAs or InP substrates are very effective. Meanwhile, many modern integrated circuit technologies, such as CMOS, typically rely on silicon substrates. Thus, if wafer 600 were made of gallium arsenide and attached to a silicon substrate, a photodiode 614 could be more easily used with silicon circuitry.

Fifth pillar 620 and sixth pillar 622 are connected to a loop antenna 624. Such a configuration could be useful to bring the loop antenna away 624 from other circuit elements (reducing received noise) or to allow for easier impedance matching by allowing a larger antenna to be used than would be possible on the same substrate as the receiving or driving technology.

The illustrative example shown in FIG. 20 could be used, for example, as a transducer for converting an optical communication signal to a wireless signal. For example, the crystal 606 could be used to provide timing functions to a circuit receiving optical signals with the photodiode 614. Isolating the crystal 606 from operating circuitry may, for example, reduce the timing jitter of an optical receiver. Circuitry on a data processing chip attached to wafer 600 may convert the bits received by the photodiode 614 into a modulated signal for transmission via the loop antenna. Because the antenna is provided on a separate chip, the output impedance required may be reduced since the antenna can be larger without sacrificing area on the data processing chip.

Also shown in FIG. 20 is the inclusion of an outer ring structure 630. Upon the outer ring structure 630, solder 632 is placed, as well as smaller bumps 633 placed on each of the several pillars. By controlling the size of the solder bumps 633, electrical connections may be made for the several pillars. Meanwhile, the outer solder ring 632 may be allowed to be thicker or more complete so that a hermetic or vacuum seal may be provided between wafer 600 and a second chip.

While the illustrative example of FIG. 20 includes a crystal 606, a photodiode 614, and an antenna 624, other devices may also be included. As noted above, inductors and capacitors may be included, while in other embodiments, transistors, resistors, other diodes, logic devices, transducers, regulators, microfluidic devices, sensors, oscillators, and the like may also be included if desired. For example, in some circuits a regulator for controlling voltage levels may be used to control, for example, oscillation amplitudes; however, regulators typically require heat sinks that may cost space on a chip, so that provision of a regulator on a second chip bonded to other devices may prove useful.

Figure 21A:
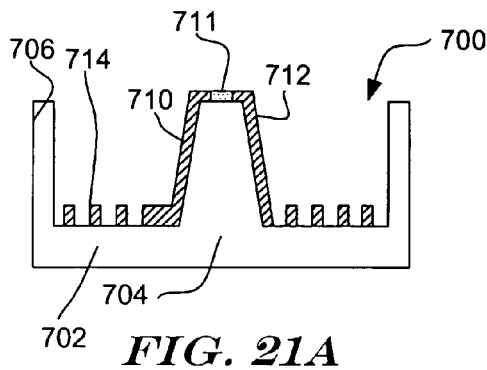
FIGS. 21A–21E illustrate several views of additional example embodiments.

FIGS. 21A–21E illustrate another example embodiment of the present invention. FIG. 21A shows a schematic cross section of an illustrative device 700 build on wafer 702. Bulk from wafer 702 has been removed to leave behind a pillar 704 and side structure 706; such bulk may be removed as discussed above, for example, by etching or mechanical processes, or wafer 702 could be formed by a molding process as well. As illustrated, pillar 704 includes slanted sidewalls that may help first metallization 710 and second metallization 712 achieve good step coverage. A gap 711 is left on top of pillar 704 and may be filled with a dielectric to provide electrical isolation of the two metallizations 710, 712. An inductive element 714 has also been placed, for example by shadow masked deposition, onto wafer 702. Rather than a single pillar 704, an array of such pillars, each with its own inductive element 714 may also be fabricated in much the same fashion.

Figure 21B:
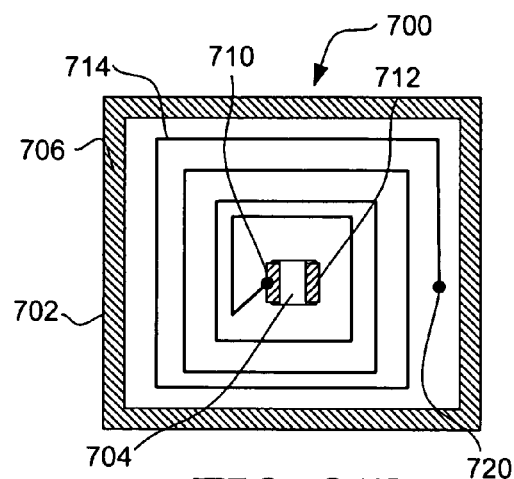
Figure 21C:
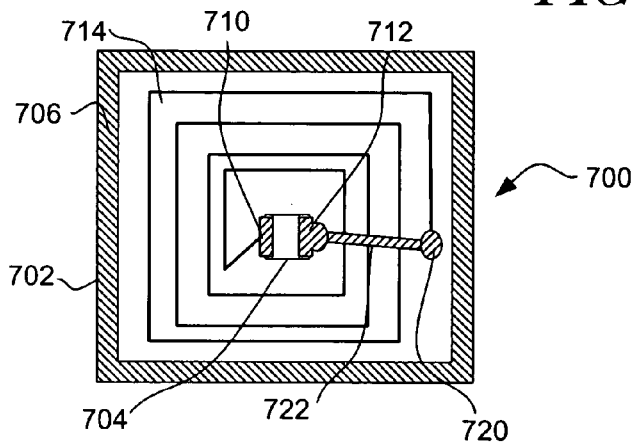

FIG. 21B shows an overhead view of the device 700 at the stage of processing shown in FIG. 21A. As illustrated, wafer 702 has been shaped to include pillar 704 and side structure 706, and metallizations 710, 712 have been added along with inductive element 714. Inductive element 714 is shown with one end coupled to the first metallization 710, while an outer end 720 of the coil structure of inductive element 714 is shown uncoupled. As illustrated in FIG. 21C, the next step of processing would be to couple the inductive element outer end 720 to the second metallization 712 with a connection 722. However, because the inductive element 714 is itself conductive, simply adding the connection 722 over the top of inductive element 714 would short out the device and so is not a possibility.

Figure 21D:
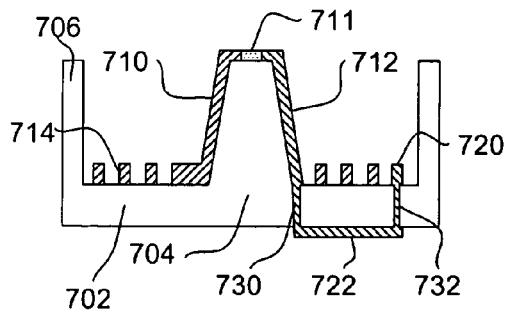
Figure 21E:
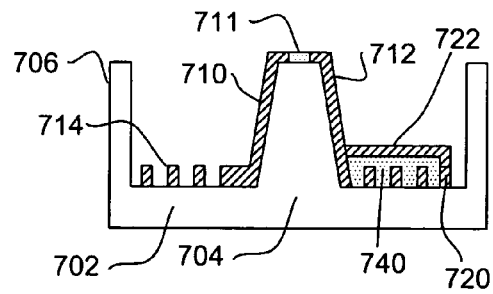

FIGS. 21D and 21E illustrate two possible solutions to the problem of providing connection 722. In FIG. 21D, connection 722 is realized by providing two vias 730, 732 that enable connection 722, disposed on the opposite side of wafer 702 from inductive element 714 outside end 720 and metallization 712, to be coupled to both. In FIG. 21E, a dielectric layer 740 may be deposited over at least a portion of the inductive element 714 so that connection 722 may be placed over top of the dielectric 740 between the inductive element 714 outside end 720 and the metallization 712.

After the steps resulting in the configurations shown in FIGS. 21D and 21E are complete, the device 700 may be attached to a wafer having contact pads corresponding to the two metallizations 710, 712 as explained above. Because both metallizations 710, 712 are on the same pillar 704, the illustrative embodiment may require less space on a second wafer than, for example, the embodiment shown in FIGS. 9A–9B. Likewise, contact pads on a second wafer may be more closely spaced. As noted above, rather than metallizations 710, 712, the pillar 704 may be doped with a substance causing it to become conductive in selected regions.

Similar methods to those illustrated in FIGS. 21A–21E may be used to provide other devices, for examples capacitors, transistors, optical elements and the like using a single pillar with dual metallizations thereon as individual devices or arrays or combinations of different individual devices, for example. For example, a capacitor and an inductor could be provided on the same wafer, the capacitor built in one area using one pillar, and the inductor built in another area with another pillar, where deposition steps for each of the two could be performed with masks adapted for treating the different areas differently.

Those skilled in the art will recognize that the present invention may be manifested in a variety of forms other than the specific embodiments described and contemplated herein. Accordingly, departures in form and detail may be made without departing from the scope and spirit of the present invention as described in the appended claims.

What is claimed is:

1. A method of attaching two wafers, the method comprising:
providing a first wafer having a first side and a second side;
providing a second wafer having a first side and a second side;
creating at least one pit into the first side of the second wafer to define at least two pillars, wherein the pit has a perimeter with perimeter walls, and the at least two pillars extend up from a bottom of the pit and are spaced inward from the perimeter walls of the pit;
adapting at least one of the pillars to conduct an electrical signal by doping an area of the pillar;
providing a contact pad on a first side of the first wafer;
aligning the first wafer and the second wafer such that the at least one pillar that is adapted to conduct an electrical signal corresponds to the contact pad;
attaching the first wafer to the second wafer, wherein an electronic component comprising an inductor is on the second wafer and electrically connected to the contact pad on the first wafer via at least one of the pillars.

2. The method of claim 1 wherein the inductor is provided on the first side of the second wafer.

3. The method of claim 1 wherein the inductor is provided on the second side of the second wafer.

4. The method of claim 1 wherein the inductor is integral to the second wafer.

5. The method of claim 1 wherein the electronic component includes a capacitor.

6. The method of claim 1 wherein the electronic component includes a transformer.

7. The method of claim 1 wherein the electronic component includes a transistor.

8. The method of claim 1 wherein the electronic component includes an optical device.

9. The method of claim 6 wherein the optical device is adapted to receive an optical signal.

10. The method of claim 6 wherein the optical device is adapted to produce an optical signal.

11. The method of claim 1 wherein the electronic component is an antenna.

12. The method of claim 1 wherein the step of attaching the first wafer to the second wafer includes causing an area of solder provided on at least one of the first wafer and the second wafer to reflow.

13. The method of claim 1 further including the step of providing a slanted side on the pillar, the slanted side being adapted for receiving a deposited conductive material.

14. The method of claim 1 wherein the step of attaching the first wafer to the second wafer includes creating a sealed chamber between the first wafer and the second wafer.

15. The method of claim 1 wherein the step of attaching the first wafer to the second wafer includes adhering the first wafer to the second wafer using a method chosen from the group consisting of soldering, glass frit, anodic banding, fusion bonding, photoresist adhesion, polymethyl methacrylate bonding, wax bonding, low temperature glass melt, and bonding using an applied adhesive.

16. A method comprising:
providing a first wafer having a first side and a second side;
providing a second wafer having a first side and a second side;
creating at least one pit into the first side of the second wafer to define at least a first pillar and a second pillar, wherein the pit has a perimeter with perimeter walls, and the pillars extend up from a bottom of the pit and are spaced inward from the perimeter wall of the pit;
adapting the first pillar to conduct an electrical signal;
adapting the second pillar to conduct an electrical signal by doping an area of the pillar;
providing an electronic device comprising an inductor having a first lead and a second lead, the first lead coupled to the first pillar and the second lead coupled to the second pillar;
providing a first contact pad and a second contact pad on a first side of the first wafer;
aligning the first wafer and the second wafer such that the first pillar corresponds to the first contact pad and the second pillar corresponds to the second contact pad;
attaching the first wafer to the second wafer.

17. A method comprising:
providing a first wafer having a first side and a second side;
providing a second wafer having a first side and a second side;
creating at least one pit having a perimeter with perimeter walls into the first side of the second wafer to define a pillar, wherein the pillar extends up from a bottom of the pit and is spaced inward from the perimeter walls of the pit;
adapting a first region of the pillar to conduct an electrical signal;
adapting a second region of the pillar to conduct an electrical signal, the second region being substantially electrically isolated from the first region by doping an area of the pillar;
providing an electronic device comprising an inductor having a first lead and a second lead, the first lead electrically coupled to the first region of the pillar and the second lead electrically coupled to the second region of the pillar;
providing a first contact pad and a second contact pad on a first side of the first wafer; and
attaching the first wafer to the second wafer such that the first region of the pillar is electrically connected to the first contact pad and the second region of the pillar is electrically connected to the second contact pad.

18. A method comprising:
providing a first wafer with a circuit, the circuit including a first contact pad and a second contact pad;
providing a second wafer having a first side and a second side;
removing portions of the first side of the second wafer to define a pit having a perimeter with perimeter walls, and a pillar extending up from a bottom of the pit, wherein the pillar is spaced inward from the perimeter walls of the pit;
adapting a first region of the pillar to be electrically conductive;
adapting a second region of the pillar to be electrically conductive, the second region electrically separate from the first region;
applying a metallization layer to at least the first side of the pillar, the metallization layer defining an inductive element having a first lead and a second lead;
providing an electrical connection between the first lead and the first region;
providing an electrical connection between the second lead and the second region;
attaching the first side of the second wafer to the first wafer such than an electrical connection between the first region and the first contact pad is created and an electrical connection between the second region and the second contact pad is created wherein the step of providing an electrical connection between the second lead and second region includes the steps of:
providing a conductive element along the second side of the second wafer;
placing a first via from the first side of the second wafer to the second side of the second wafer, the first via providing an electrical connection between the second lead and the conductive element;
placing a second via from the first side of the second wafer to the second side of the second wafer, the second via providing an electrical connection between the second region and the conductive element.

19. The method of claim 18 wherein the step of providing an electrical connection between the second lead and the second region includes the steps of:
applying a dielectric layer over a portion of the metallization layer corresponding to a region of the inductive element; and
providing a conductive element from the second lead to the second region over the dielectric layer.

* * * * *

UNITED STATES PATENT AND TRADEMARK OFFICE
CERTIFICATE OF CORRECTION

| | | |
|---|---|---|
| PATENT NO. | : 7,166,493 B2 | |
| APPLICATION NO. | : 10/811572 | |
| DATED | : January 23, 2007 | |
| INVENTOR(S) | : James F. Dentry and Andrezej Peczalski | |

It is certified that error appears in the above-identified patent and that said Letters Patent is hereby corrected as shown below:

Col 1, line 7, delete "INTERGRATED" and replace with -- INTEGRATED --.

In claim 9, line 64, please delete: "The method of claim 6 wherein the optical device is adapted to receive an optical signal.", and add: -- The method of claim 8 wherein the optical device is adapted to receive an optical signal. --.

In claim 10, line 66, please delete: "The method of claim 6 wherein the optical device is adapted to produce an optical signal.", and add: -- The method of claim 8 wherein the optical device is adapted to produce an optical signal. --.

Signed and Sealed this

Twelfth Day of June, 2007

JON W. DUDAS
*Director of the United States Patent and Trademark Office*

UNITED STATES PATENT AND TRADEMARK OFFICE
CERTIFICATE OF CORRECTION

PATENT NO. : 7,166,493 B2 Page 1 of 1
APPLICATION NO. : 10/811572
DATED : January 23, 2007
INVENTOR(S) : James F. Detry and Andrezej Peczalski It is certified that error appears in the above-identified patent and that said Letters Patent is hereby corrected as shown below:

Cover Page, item [75] Inventor, please delete "James F. Dentry", replace with -- James F. Detry --.

Signed and Sealed this

Nineteenth Day of June, 2007

JON W. DUDAS
*Director of the United States Patent and Trademark Office*